(12) United States Patent
Wells et al.

(10) Patent No.: US 11,913,638 B2
(45) Date of Patent: Feb. 27, 2024

(54) ALL METAL SURFACE MOUNT REFLECTOR

(71) Applicant: CoreLED Systems, LLC, Livonia, MI (US)

(72) Inventors: Brian C. Wells, Grosse Pointe Farms, MI (US); Derek Mallory, Northville, MI (US); Nadia Zelikovskaya, Plymouth, MI (US); John Kahl, Troy, MI (US)

(73) Assignee: CoreLED Systems, LLC, Livonia, MI (US)

( * ) Notice: Subject to any disclaimer, the term of this patent is extended or adjusted under 35 U.S.C. 154(b) by 0 days.

(21) Appl. No.: 17/843,526

(22) Filed: Jun. 17, 2022

(65) Prior Publication Data
US 2023/0408065 A1    Dec. 21, 2023

(51) Int. Cl.
*F21V 7/10* (2006.01)
*H05K 1/02* (2006.01)
*F21Y 115/10* (2016.01)

(52) U.S. Cl.
CPC .............. *F21V 7/10* (2013.01); *H05K 1/0274* (2013.01); *F21Y 2115/10* (2016.08)

(58) Field of Classification Search
CPC .................................. F21V 7/10; H05K 1/0274
See application file for complete search history.

(56) References Cited

U.S. PATENT DOCUMENTS

| | | | |
|---|---|---|---|
| 2014/0063802 A1* | 3/2014 | Garcia | F21V 5/08 362/241 |
| 2014/0233245 A1* | 8/2014 | Kerpe | H05K 1/0209 362/296.04 |
| 2015/0036342 A1* | 2/2015 | Yang | F21K 9/68 362/241 |
| 2015/0340545 A1* | 11/2015 | Kim | H01L 33/005 29/527.4 |
| 2016/0069533 A1* | 3/2016 | Schmidt | F21V 7/24 362/225 |
| 2018/0301604 A1* | 10/2018 | Liu | H01L 33/0095 |

* cited by examiner

*Primary Examiner* — Christopher E Dunay
(74) *Attorney, Agent, or Firm* — Gunther J. Evanina; BUTZEL LONG

(57) ABSTRACT

A surface mountable reflector suitable for packaging in a tape and reel format for positioning on a circuit substrate using pick-and-place robotics, and attachment using a solder reflow mounting technique, includes a metal sheet stamped to provide an all metal structure having a plurality of reflector surfaces having lower edges, and mounting pads that extend below the lower edges and outwardly of the reflector surfaces. The surface mountable reflectors are usable in a radiation emitting diode assembly including a diode solder-mounted to the circuit substrate with the surface mountable reflector affixed to the circuit substrate.

13 Claims, 4 Drawing Sheets

ALL METAL SURFACE MOUNT REFLECTOR

FIELD OF THE DISCLOSURE

This disclosure pertains to reflectors for radiation emitting diodes, including light emitting diodes (LEDs), infrared radiation emitting diodes, and ultraviolet radiation emitting diodes; and, in particular, to reflectors adapted for high speed pick-and-place and solder reflow assembly operations that facilitate simultaneous or substantially concurrent attachment of the radiation emitting diode and the reflector to a circuit board.

BACKGROUND OF THE DISCLOSURE

Light emitting diodes are used in a variety of lighting applications including automotive displays, instrument displays, accent lighting, etc. Infrared emitting diodes are used, for example, in remote controllers, and in cameras to illuminate a lens frame when light levels are low. Ultraviolet radiation emitting diodes are used in various analytic devices for detecting materials not visible to the human eye (e.g., checking ultraviolet watermarks to validate currency and certificates), and for sterilization and disinfection. In these and various other applications it is often desirable to redirect and/or partially block radiation emitted from the diode in order to make efficient use of the emitted radiation and reduce or prevent damage to radiation-sensitive components in proximity to the radiation emitting diode.

In order to reduce manufacturing costs, and to minimize the size and weight of the device on which the radiation emitting diode is used, it is increasingly desirable to mount both the diodes and the reflectors concurrently on a circuit substrate using high-speed pick-and-place and solder reflow assembly techniques. Additionally, it has been found that surface mountable reflectors for radiation emitting diodes can be most economically produced using simple metal stamping techniques, including cutting, piercing, and folding operations.

U.S. Patent Application Publication No. US 2014/0233245 A1, published Aug. 21, 2014, describes metal surface mount reflectors soldered to a printed circuit board adjacent an LED that is also soldered to the printed circuit board. The individual surface mount reflectors of this publication either have only a single reflector (FIGS. 1-4, 8 and 10-13), requiring multiple pick-and-place operations for each associated LED, or a surface mount reflector with a plurality of reflectors and a base that circumscribes the reflectors and LED, and that is soldered to the printed circuit board. A significant disadvantage is that the soldered circumscribing base limits design flexibility by restricting component placement on the circuit board and/or requiring multiple layer circuit boards with vias.

SUMMARY OF THE DISCLOSURE

Disclosed are improved surface mountable reflectors for use with radiation emitting diodes, and devices employing the surface mountable reflectors. The surface mountable reflectors described in this disclosure comprise or consist of a single metal sheet that has been cut and bent, or a plurality of metal sheets that have been cut, bent and joined together, to form a unitary all-metal structure including a plurality of reflector surfaces having lower edges, and at least two mounting pads that extend below the lower edge of at least one reflector surface and outwardly of the reflector surfaces. The mounting pads provide a space or gap between the lower edge of at least one reflector surface and a circuit substrate on which the reflector is mounted to allow greater design flexibility in positioning of components and/or routing of electrically conductive paths on the mounting surface of the circuit substrate.

DETAILED DESCRIPTION

Figure 1:
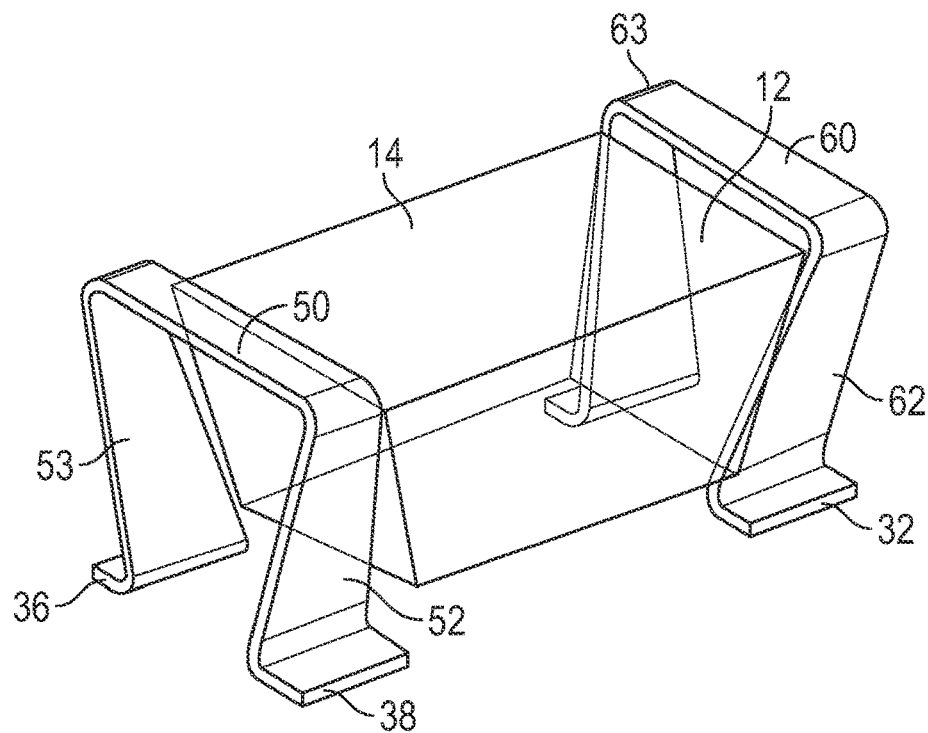
FIG. 1 is a perspective view of a first embodiment of the disclosed surface mountable reflector for use with a radiation emitting diode.
Figure 2:
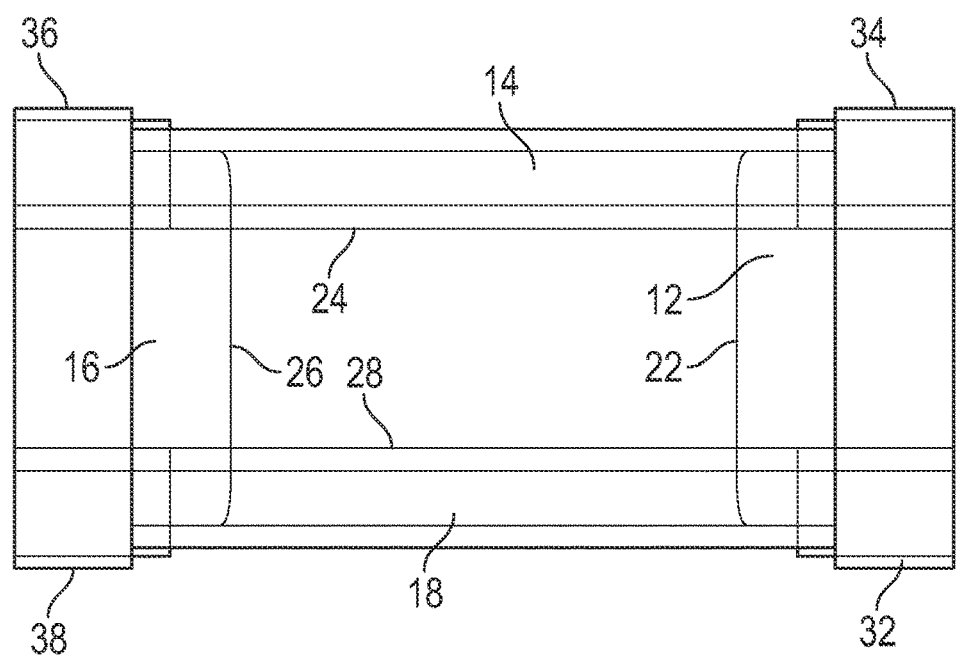
FIG. 2 is a top view of the reflector shown in FIG. 1.

Shown in FIGS. 1 and 2 is a first embodiment of a surface mountable reflector 10 in accordance with this disclosure. Surface mountable reflector 10 includes four reflective surfaces 12, 14, 16 and 18. Reflective surfaces 12, 14, 16 and 18 have lower edges 22, 24, 26 and 28, respectively. Mounting pads 32, 34 extend from a support structure or frame segment 50 having legs 52, 53, such that pads 32, 34 are positioned below lower edges 22, 24, 26 and 28 of the reflective surfaces and outwardly of (i.e., further from the center of reflector 10) the reflective surfaces. Similarly, mounting pads 36 and 38 extend from support structure or frame segment 60 having legs 62, 63, such that pads 36, 38 are positioned below the lower edges of the reflective surfaces and outwardly of the reflective surfaces. This structure provides a gap or space between the lower edges of the reflective surfaces and a circuit substrate on which reflector 10 is attached via pads 32, 34, 36 and 38, allowing components or electrical conductive paths to be positioned on the circuit substrate between pads 32, 34, 36 and 38 and/or below edges 22, 24, 26 and 28.

Surface mountable reflector 10 is fabricated from a single sheet of metal that is cut and bent as illustrated. Suitable sheet metal materials include stainless steel, brass, tin, and copper. However, generally any metal sheet material that can be cut and bent into the desired structure will suffice. In those cases in which greater reflectivity are desired, the reflective surfaces 12, 14, 16, 18 can be polished and/or provided with a reflective metal coating. Techniques that can be employed include electroplating, electroless plating, vapor deposition, and sputter deposition. Plating materials can be selected from gold, silver, copper, rhodium, chrome, zinc, zinc-nickel, tin, nickel, and others.

Figure 3:
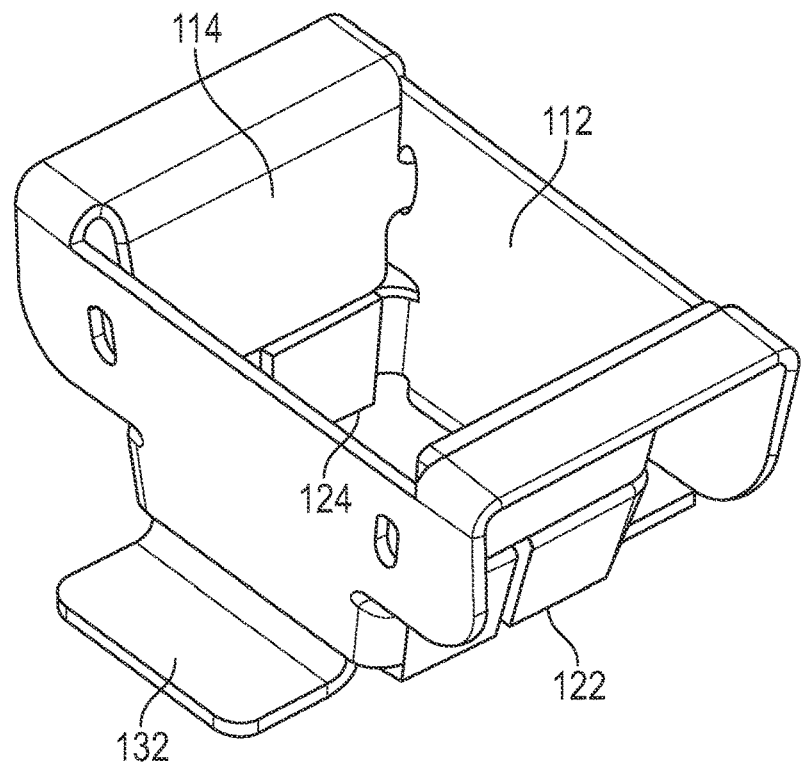
FIG. 3 is a perspective view of a second embodiment of the disclosed surface mountable reflector for use with a radiation emitting diode.
Figure 4:
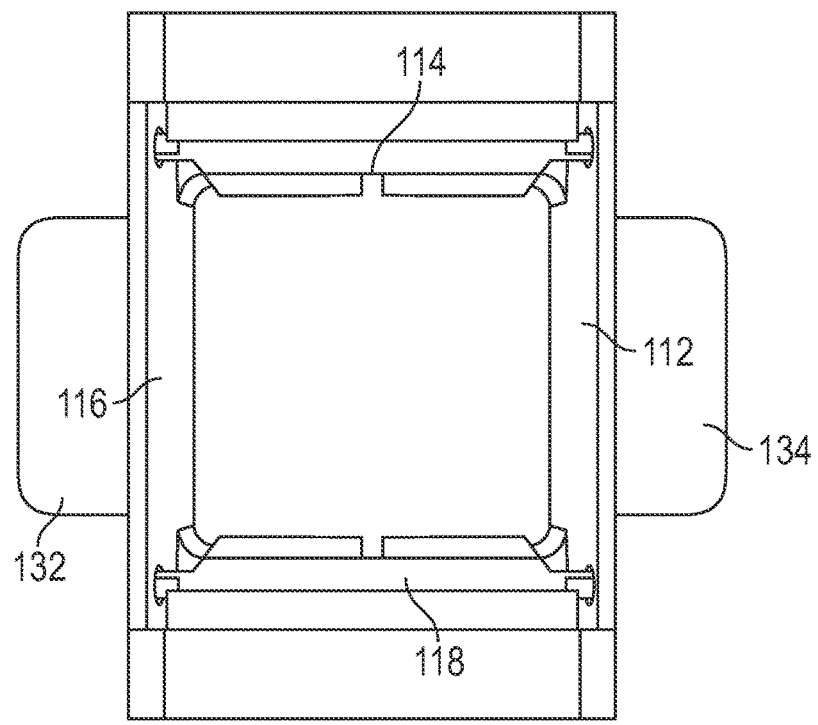
FIG. 4 is a top view of the reflector shown in FIG. 3.

Shown in FIGS. 3 and 4 is another embodiment of a surface mountable reflector 110 in accordance with this disclosure. Surface mountable reflector 110 includes reflector surfaces 112, 114, 116 and 118, and mounting pads 132, 134. As with reflector 10, reflector 110 has pads 132 and 134 positioned below lower edges 122 and 124 of reflectors 114, 118 to provide a gap or clearance between the lower edges 122, 124 and a circuit substrate on which pads 132 and 134 are attached by solder joints. Because pads 132, 134 are extensions of the structure defining reflective surfaces 112 and 116, there is somewhat less flexibility in locating components and electrically conductive paths on a circuit substrate. Nevertheless, there is a gap between lower edges 122, 124 and a circuit substrate, allowing some flexibility with respect to positioning of electrically conductive paths and/or components below edges 122, 124.

As with reflector 10, reflector 110 is fabricated from a single sheet of metal using cutting and folding operations. Also, as with reflector 10, surfaces 112, 114, 116 and 118 can be provided with a high reflectivity treatment, such as polishing and/or metal plating as previously described.

Figure 5:
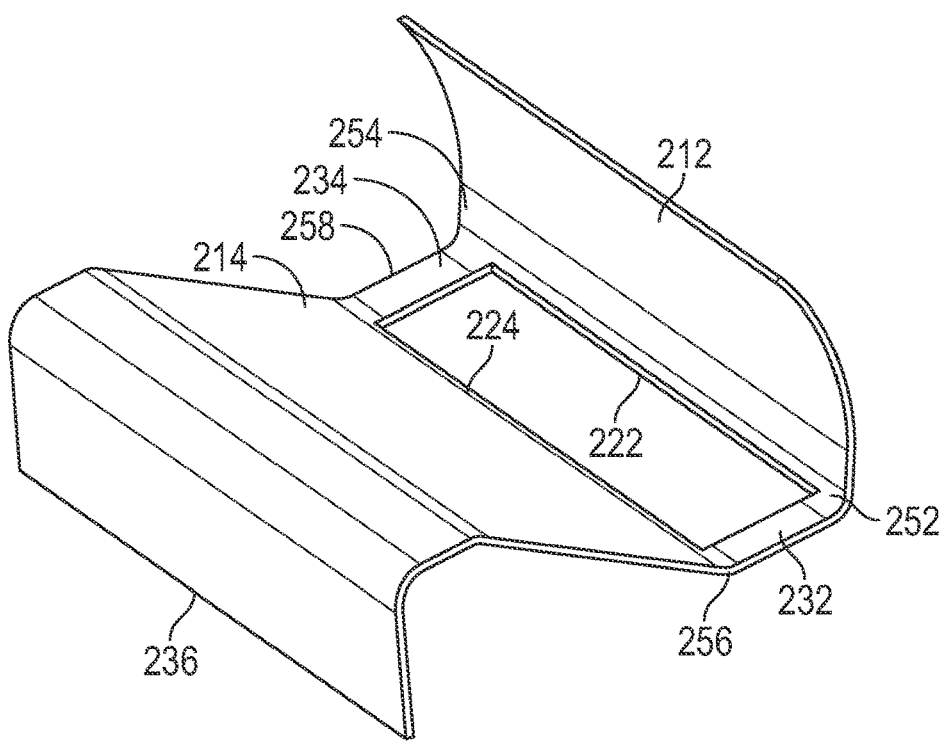
FIG. 5 is a perspective view of a third embodiment of the disclosed surface mountable reflector for use with a radiation emitting diode.
Figure 6:
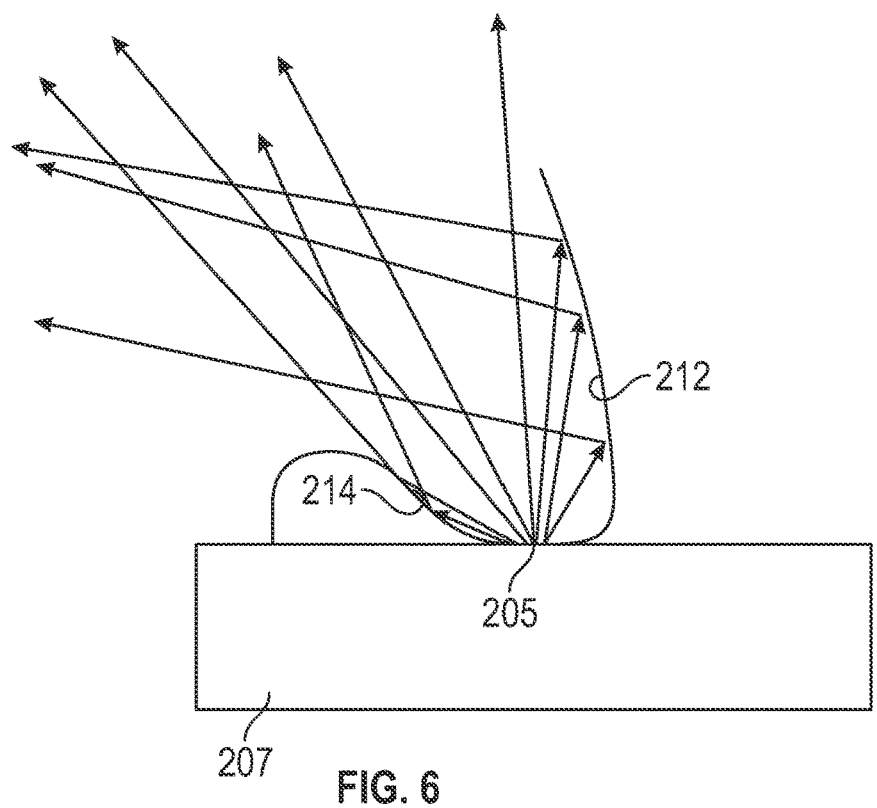
FIG. 6 is a side view of the reflector shown in FIG. 5 mounted on a circuit substrate.

Another embodiment of a surface mountable reflector 210 in accordance with this disclosure is shown in FIGS. 5 and 6. Reflector 210 includes a first reflective surface 212 that reflects radiation emitted from a source 205 in a direction generally parallel with a circuit substrate 207 (e.g., printed circuit board) on which source 205 and reflector 210 are solder mounted. Reflector 210 also includes a second reflective surface 214 that reflects radiation at a second angle (e.g., about degrees from the plane of substrate 207). Radiation is also propagated directly from source 205 along a path generally perpendicular to the plane of substrate 207. This particular embodiment is illustrative of a broader concept in which reflective surfaces can be angled to create three or more distinct images from a radiation emitting source 205.

Reflector 210 includes mounting pads 232, 234 and 236. Stanchions or posts 252, 254 space lower edge 222 of reflective surface 212 from circuit substrate 207, and stanchions or posts 256, 258 space lower edge 224 of reflective surface 214 from circuit substrate 207. As with reflectors 10 and 110, reflector 210 is cut and bent from a single piece of metal sheet, and surfaces 212, 214 can be polished and/or metal plated, as previously described, to enhance reflectivity.

Figure 7:
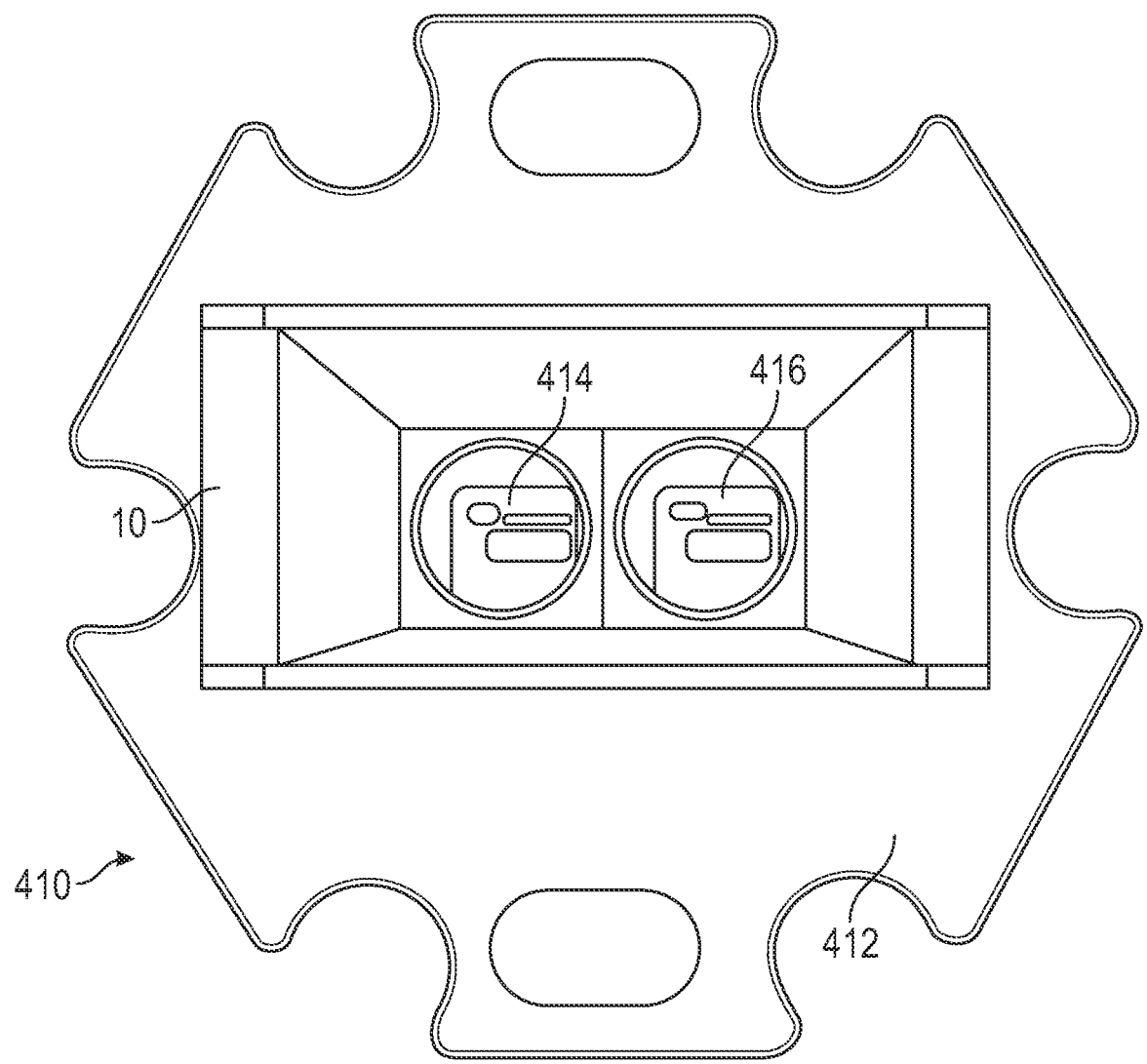
FIG. 7 is a top view of a radiation emitting diode assembly employing the reflector shown in FIGS. 1 and 2.

Shown in FIG. 7 is a radiation emitting diode assembly 410. Assembly 410 includes a circuit substrate 412, radiation emitting diodes 414, 416 and a surface mountable reflector (as previously described). Diodes 414, 416 and reflector are preferably packaged in a tape and reel format, positioned using pick-and-place robotics, and soldered to substrate 412 via a solder reflow mounting technique, whereby rapid, high-precision, low cost production is achievable.

The circuit substrates referred to herein encompass any printed circuit board or printed wiring board comprising at least one electrically conductive layer and at least one insulating layer, on which electronic components can be solder mounted, and that include a pattern of electrical conductors for providing appropriate connections among the electronic components.

The various surface mountable reflectors disclosed herein may be used with generally any type of radiation emitting diodes, including visible light emitting diodes (LEDs), infrared emitting diodes (sometimes referred to as IR-LEDs), and ultraviolet radiation emitting diodes (sometimes referred to as UV-LEDs). The radiation emitting diodes referred to herein include conventional radiation emitting diode packages having one or more radiation emitting diode chips supported on a lead frame and encapsulated or contained in a transparent housing, as well as chip scale packages (CSPs) that typically consist of a die on which a phosphor layer is coated and with the underside of the die being metallized with electrical contacts.

The electrically conductive paths referenced herein are any conductive path used in a circuit substrate to provide appropriate electrical connections among electronic components mounted on the circuit substrate.

In certain illustrated embodiments, the surface mountable reflectors have lower edges, which together define an opening in which the radiation emitting diode package is located when both the diode packages and reflector are solder mounted on a circuit substrate. In the illustrated embodiment, the opening is rectangular. However generally any other shape opening is envisioned.

While the radiation emitting diode and the surface mountable reflector can be conveniently soldered to the circuit substrate in a single solder reflow operation, the surface mountable reflector may, as an alternative, be affixed to the circuit substrate using another technique such as adhesive bonding.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the claims attached herein.

The invention claimed is:

1. A surface mountable reflector for use with a radiation emitting diode, comprising:
a single metal sheet that has been cut and bent, or a plurality of metal sheets that have been cut, bent and joined together, to form a unitary all-metal structure including a plurality of reflector surfaces having lower edges, and at least two mounting pads that extend below the lower edges of the reflector surfaces and outwardly of the reflector surfaces, such that the mounting pads are positioned below lower edges of the reflector surfaces to provide a space between the lower edges of the reflector surfaces and a circuit substrate when the surface mountable reflector is attached to a circuit substrate via the mounting pads.

2. The surface mountable reflector of claim 1, in which one or more of the reflector surface is provided with metal plating to enhance reflectivity.

3. The surface mountable reflector of claim 1, wherein the lower edges of the reflector surfaces together define an opening in which the radiation emitting diode is located when both the radiation emitting diode and the surface mountable reflector are mounted on a circuit substrate.

4. The surface mountable reflector of claim 3, wherein the opening is rectangular.

5. A radiation emitting diode assembly, comprising:
a circuit substrate;
at least one radiation emitting diode package soldered to the circuit substrate; and
a surface mountable reflector affixed to the circuit substrate, the surface mountable reflector including a single metal sheet that has been cut and bent, or a plurality of metal sheets that have been cut, bent and joined together, to form a unitary all-metal structure including a plurality of reflector surfaces having lower edges, and at least two mounting pads that extend below the lower edges of the reflector surfaces and outwardly of the reflector surfaces, such that the mounting pads are positioned below lower edges of the reflector surfaces to provide a space between the lower edges of the reflector surfaces and a circuit substrate when the surface mountable reflector is attached to a circuit substrate via the mounting pads.

6. The assembly of claim 5, wherein the at least one radiation emitting diode package includes at least one infrared radiation emitting die.

7. The assembly of claim 5, wherein the at least one radiation emitting diode package includes at least one ultraviolet radiation emitting die.

8. The assembly of claim 5, wherein the at least one radiation emitting diode package is a chip scale package.

9. The assembly of claim 5, in which one or more of the reflector surface is provided with metal plating to enhance reflectivity.

10. The assembly of claim 5, wherein the lower edges of the reflector surfaces together define an opening in which the radiation emitting diode is located when both the radiation emitting diode and the surface mountable reflector are mounted on a circuit substrate.

11. The assembly of claim 10, wherein the opening is rectangular.

12. A radiation emitting diode assembly, comprising:
a circuit substrate;
at least one radiation emitting diode package soldered to the circuit substrate; and
a surface mountable reflector affixed to the circuit substrate, the surface mountable reflector including a single metal sheet that has been cut and bent, or a plurality of metal sheets that have been cut, bent and joined together, to form a unitary all-metal structure including a plurality of reflector surfaces having lower edges, and at least two mounting pads that extend below the lower edges of the reflector surfaces and outwardly of the reflector surfaces, wherein the surface mountable reflector is affixed to the circuit substrate via solder joints at the mounting pads.

13. The assembly of claim 12, wherein the lower edges of the reflector surfaces together define an opening in which the radiation emitting diode is located when both the radiation emitting diode and the surface mountable reflector are mounted on a circuit substrate.

* * * * *